United States Patent
Kim et al.

(10) Patent No.: US 7,843,720 B2
(45) Date of Patent: Nov. 30, 2010

(54) PHASE CHANGE MEMORY AND METHOD DISCHARGING BITLINE

(75) Inventors: Hye-jin Kim, Seoul (KR); Sang-ki Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 100 days.

(21) Appl. No.: 12/256,564

(22) Filed: Oct. 23, 2008

(65) Prior Publication Data

US 2009/0129144 A1    May 21, 2009

(30) Foreign Application Priority Data

Nov. 20, 2007   (KR) .................. 10-2007-0118520

(51) Int. Cl.
*G11C 11/00* (2006.01)
(52) U.S. Cl. .................. 365/163; 365/148; 365/229; 365/230.06
(58) Field of Classification Search .............. 365/163, 365/148, 230.06, 189.09, 185.25, 229, 203
See application file for complete search history.

(56) References Cited

U.S. PATENT DOCUMENTS

| 6,667,900 | B2* | 12/2003 | Lowrey et al. | 365/171 |
| 6,816,404 | B2* | 11/2004 | Khouri et al. | 365/163 |
| 7,123,535 | B2* | 10/2006 | Kurotsuchi et al. | 365/225.7 |
| 7,206,216 | B2* | 4/2007 | Osada et al. | 365/148 |

FOREIGN PATENT DOCUMENTS

| KR | 1020060133740 A | 12/2006 |
| KR | 1020070018583 A | 2/2007 |
| KR | 1020070056667 A | 6/2007 |

* cited by examiner

*Primary Examiner*—David Lam
(74) *Attorney, Agent, or Firm*—Volentine & Whitt, PLLC

(57) ABSTRACT

Disclosed are a phase change memory device in which an active time is reduced and a method of discharging a bitline in the phase change memory device. In the phase change memory device having the reduced active time and the method of discharging the bitline in the phase change memory device, the bitline is either always discharged when the phase change memory device is in standby, is discharged after the active operation of the phase change memory device, or is discharged prior to and after the active operation of the phase change memory device.

16 Claims, 7 Drawing Sheets

PHASE CHANGE MEMORY AND METHOD DISCHARGING BITLINE

CROSS-REFERENCE TO RELATED PATENT APPLICATION

This application claims the benefit of Korean Patent Application No. 10-2007-0118520 filed on Nov. 20, 2007, the subject matter of which is hereby incorporated by reference.

BACKGROUND

The present invention relates generally to semiconductor memory devices. More particularly, the invention relates to phase change memory devices and methods of discharging a bitline in same.

Semiconductor memory devices may be generally classified as random access memory (RAM) and read only memory (ROM). ROM is a non-volatile memory that retains stored data in absence of applied power. Examples of ROM include programmable ROM (PROM), erasable PROM (EPROM), electrically EPROM (EEPROM), flash memory, etc. In contrast, RAM is a volatile memory that loses stored data when applied power is interrupted. Examples of RAM include dynamic RAM (DRAM), static RAM (SRAM), etc. RAM typically stores electrical charge indicative of a data value using a capacitor.

Besides the aforementioned memory devices, there are other types of semiconductor memory that replace the standard RAM capacitor with a non-volatile data storage element. Examples include the ferroelectric RAM (FRAM) which uses a ferroelectric capacitor, the magnetic RAM (MRAM) which uses a tunneling magneto-resistive (TMR) layer, the phase change RAM memory which uses one or more chalcogenide alloys, etc.

Phase change RAM memory, or PRAM, is a non-volatile memory device which uses a change in the phase (or state) of a material due to an applied temperature change to indicate a data state. Typically, the particular state of the phase-changeable material within a PRAM will be associated with an electrical resistance indicating a corresponding data state (e.g., a "1" or a "0" value). PRAM is relatively easy to fabricate and is therefore a cost effective approach to the implementation of a large capacity memory.

FIG. (FIG.) 1 is a diagram of a memory cell 10 of a phase change memory device. Referring to FIG. 1, the memory cell 10 is a metal-oxide semiconductor (MOS) switch type phase change memory cell, and includes a memory element 11 and a select element 12. The memory element 11 is connected between a bitline BL and the select element 12, and the select element 12 is connected between the memory element 11 and ground GND.

The memory cell 11 includes a phase change material, such as GST which is a conventionally understood material including germanium Ge, antimony Sb, and tellurium Te. GST is characterized by two stable states (i.e., a crystalline state and an amorphous state) that may be switched between by application of a appropriate temperature condition. Each of these two states has a distinct electrical resistance. The state of the GST may be defined by the application of corresponding temperature condition (i.e., a temperature level over a period of time). Such temperature conditions may be induced by application of an electric current supplied via the bitline BL. Once the phase of the GST is defined in this manner, the corresponding resistance of the memory cell (and its affect on an applied read current) may be interpreted (or detected) during read operations subsequently applied to the memory cell.

The select element 12 includes an n-type MOS (NMOS) transistor NT. A wordline WL is connected to the gate of the NMOS transistor NT. When an electric current is supplied to the wordline WL, the NMOS transistor is turned ON. When the NMOS transistor NT is turned ON, the memory element 11 receives an electric current via the bitline BL. In FIG. 1, the memory element 11 is connected between the bitline BL and the select element 12. However, the select element 12 may be connected between the bitline BL and the memory element 11.

FIG. 2 is a diagram of another memory cell 20 of a phase change memory device. Referring to FIG. 2, the memory cell 20 is a diode switch type phase change memory cell, and includes a memory element 21 and a select element 22. The memory element 21 is connected between a bitline BL and the select element 22, and the select element 22 is connected between the memory element 21 and a wordline WL. The memory element 21 is identical to the memory element 11 in FIG. 1.

The select element 22 includes a diode D. The memory element 21 is connected to the anode of the diode D, and a wordline WL is connected to the cathode of the diode D. When a difference between voltages of the anode and the cathode of the diode D is greater than the threshold voltage of the diode D, the diode D is turned on. When the diode D is turned on, the memory element 21 receives electric current via the bitline BL.

FIG. 3 is a graph describing the temperature condition characteristics of the GST shown in FIGS. 1 and 2. In FIG. 3, reference numeral 1 denotes a temperature condition used to place the GST in an amorphous state, and reference numeral 2 denotes an alternate temperature condition used to place the GST in a crystalline state.

Referring to FIG. 3, the GST enters an amorphous state when the GST is heated to a temperature higher than the melting temperature Tm of the GST by supplying an electric current over a first period of time T1, and then quickly quenching the GST. The amorphous state is generally referred as a reset state and a data value of '1' is stored in the amorphous state. In contrast, the GST enters a crystalline state when the GST is heated to a temperature higher than the crystallization temperature Tc of the GST but lower than the Tm of the GST over a second period of time T2 longer than the first period of T1. The crystalline state is generally referred as a set state, and a data value of '0' is stored in the crystalline state. Electrical resistance of a phase change memory cell varies with the amorphous volume of the GST. Thus, the electrical resistance of a phase change memory cell is relatively higher in an amorphous state and lower in a crystalline state.

A phase change memory device having the memory cell described in reference to FIGS. 1 through 3 generally discharges a corresponding bitline BL over defined period of time prior to an operation (e.g., a read or writing operation) in order to ensure proper execution of the operation. While bitline discharge is essential to the proper execution of the operation, the time required to do so is additive to the overall period of time necessary to perform a read or write operation. Therefore, the time required to discharge a bitline has the effect of extending read/write times and reducing the overall speed of operation for the memory device.

SUMMARY OF THE INVENTION

Embodiments of the invention provide a phase change memory device and method of operation characterized by more rapid bitline discharge, and faster overall operation.

In one embodiment, the invention provides a phase change memory device including a memory cell connected to a wordline and a bitline, a wordline driving circuit connected to the wordline and activating the wordline when the phase change memory device is in an active operation, a discharge control circuit generating a discharge control signal activated when the phase change memory device is in standby, and a discharge circuit connected to the bitline and discharging the bitline when the phase change memory device is in standby in response to the activation of the discharge control signal.

In another embodiment, the invention provides a phase change memory device including; a memory cell connected to a wordline and a bitline, a wordline driving circuit connected to the wordline and activating the wordline during an active operation, a discharge control circuit generating a discharge control signal activated after the active operation, and a discharge circuit connected to the bitline and discharging the bitline in response to the activated discharge control signal following the active operation.

In another embodiment, the invention provides a method of discharging a bitline in a phase change memory device comprising a memory cell connected to a wordline and the bitline, the method comprising only discharging the bitline when the phase change memory device is in standby and the wordline is activated.

In another embodiment, the invention provides a method of discharging a bitline in a phase change memory device comprising a memory cell connected to a wordline and the bitline, the method comprising discharging the bitline after an active operation of the phase change memory device and when the wordline is activated.

DESCRIPTION OF EMBODIMENTS

Figure 1:
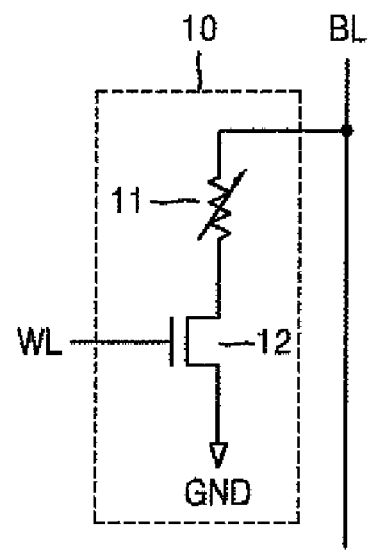
FIG. 1 is a diagram of a conventional memory cell for a phase change memory device.
Figure 2:
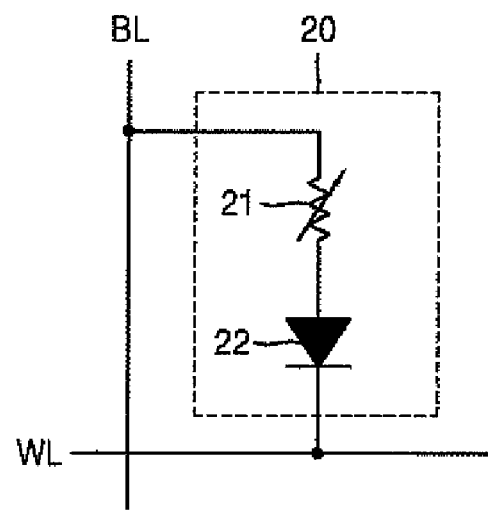
FIG. 2 is a diagram of another conventional memory cell for a phase change memory device.
Figure 3:
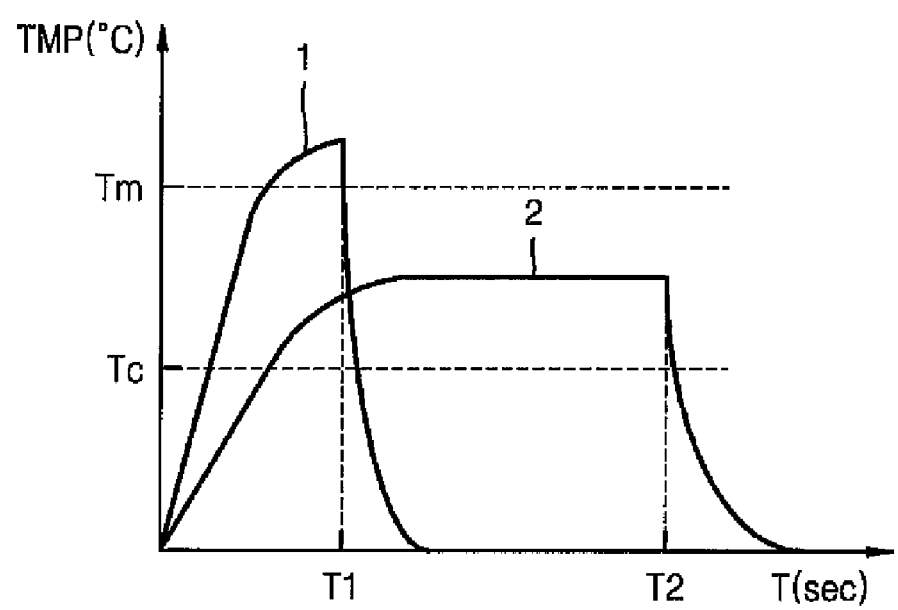
FIG. 3 is a graph for describing characteristics of an exemplary phase change material (GST) assumed in FIGS. 1 and 2.

Hereinafter, the present invention will be described in some additional detail with reference to the attached drawings. Throughout the written description and drawings, like reference numerals and symbols are used to denote like or similar elements.

Figure 4:
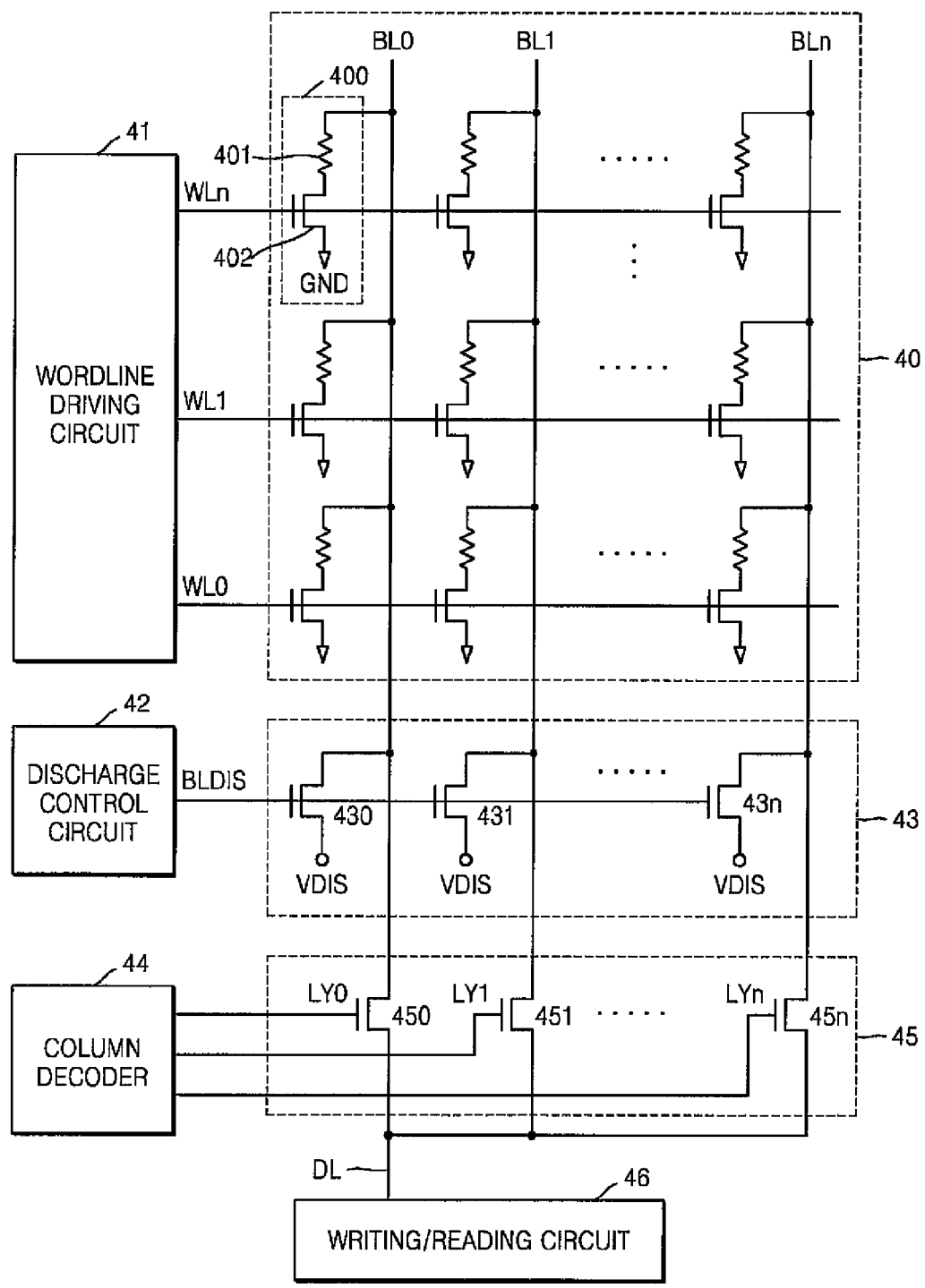
FIG. 4 is a schematic block diagram of a phase change memory device according to an embodiment of the invention.

FIG. 4 is a block diagram of a phase change memory device according to an embodiment of the invention. Referring to FIG. 4, the phase change memory device includes a memory cell array 40, a wordline driving circuit 41, a discharge control circuit 42, a discharge circuit 43, a column decoder 44, a bitline selecting circuit 45, and a writing/reading circuit 46.

The memory cell array includes a plurality of metal-oxide semiconductor (MOS) switch type phase change memory cells 400. The MOS switch type phase change memory cells 400 are connected to a plurality of wordlines WL0 through WLn and a plurality of bitlines BL0 through BLn. Each of the memory cells 400 includes a memory element 401, connected to one of the bitlines BL0 through BLn at one end, and a select element 420, interconnected between another end of the memory element 401 and a ground line GND.

The memory element 401 includes a phase change material, while the select element 402 includes an n-type MOS (NMOS) transistor, which is interconnected between the other end of the memory element 401 and the ground line GND. One of the wordlines WL0 through WLn is connected to a gate of the NMOS transistor.

The wordline driving circuit 41 is connected to the plurality of wordlines WL0 through WLn, and selects the wordlines WL0 through WLn by decoding an externally provided row address. The wordline driving circuit 41 selectively activates wordlines WL0 through WLn when the memory device executes a read/write operation. In a MOS switch type phase change memory device as shown in FIG. 4, the wordlines WL0 through WLn are selectively activated to a supply voltage level VCC during a read/write operation, and the wordlines WL0 through WLn drop to a ground voltage GND level when the memory device is placed in a standby mode of operation.

The column decoder 44 decodes an externally provided input column address to generate bitline selecting signals LY0 through LYn, and the bitline selecting circuit 45 selects bitlines BL0 through BLn in response to the bitline selecting signals LY0 through LYn. The bitline selecting circuit 45 includes a plurality of NMOS transistors 450 through 45n.

The NMOS transistors 450 through 45n connect the bitlines BL0 through BLn and a dataline DL. For example, if a bitline selecting signal LY0 is enabled by a logically high signal (i.e., a "HIGH"), a bitline BL0 and the dataline DL are electrically connected.

The discharge control circuit 42 generates a discharge control signal BLDIS, and the discharge circuit 43 is connected to the bitlines BL0 through BLn and discharges the bitlines BL0 through BLn in response to activation of the discharge control signal BLDIS. The discharge circuit 43 is interconnected between the bitlines BL0 through BLn and discharge voltage terminals VDIS, and includes a plurality of NMOS transistors 430 through 43n having gates to which the discharge control signal BLDIS is applied.

Figure 6:
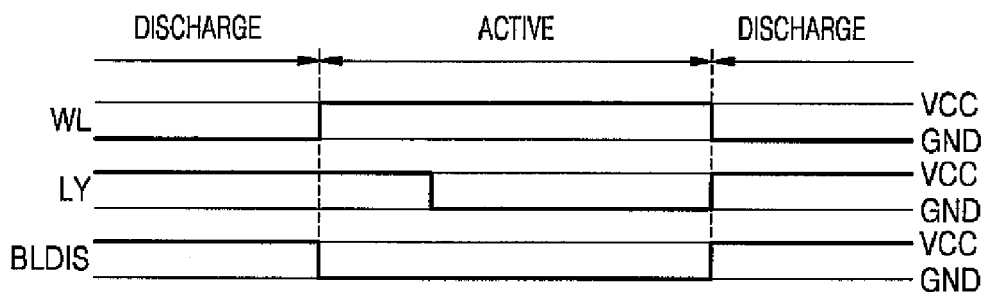
FIG. 6 is a timing diagram further describing a method of discharging a bitline in the phase change memory device shown in FIG. 4 according to an embodiment of the invention.

The phase change memory device according to an embodiment of the invention is configured in such a manner that the discharge control circuit 42 generates the discharge control signal BLDIS activated at HIGH when the phase change memory device is in the standby mode, which is when the phase change memory device is not executing a read/write operation (hereafter, collectively or singularly indicated as an ACTIVE operation), as shown in FIG. 6. In this case, the discharge circuit 43 always discharges the bitlines BL0 through BLn in response to the activation of the discharge control signal BLDIS when the phase change memory device is in standby mode.

Figure 8:
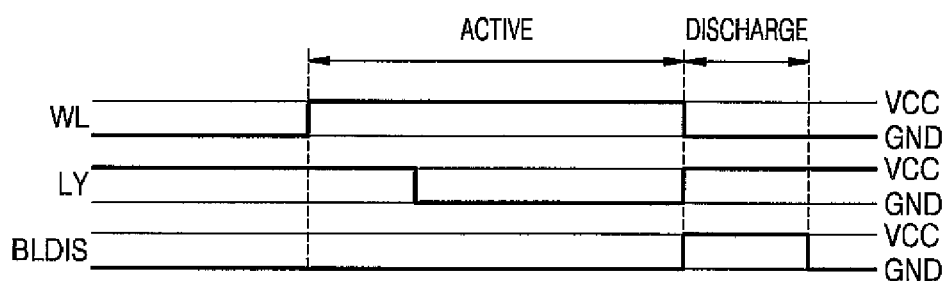
FIG. 8 is a timing diagram further describing a method of discharging a bitline in the phase change memory device shown in FIG. 4 according to another embodiment of the invention.

Also, the phase change memory device according to an embodiment of the invention may be configured in such a manner that the discharge control circuit 42 generates the discharge control signal BLDIS activated at HIGH after the active operation ACTIVE of the phase change memory device, as shown in FIG. 8. In this case, the discharge circuit 43 discharges the bitlines BL0 through BLn during the activation of the discharge control signal BLDIS after the active operation ACTIVE of the phase change memory device.

Figure 10:
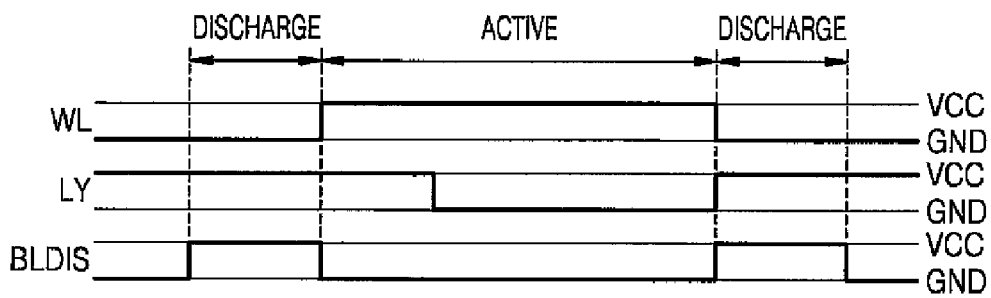
FIG. 10 is a timing diagram further describing a method of discharging a bitline in the phase change memory device shown in FIG. 4 according to another embodiment of the invention.

Also, the phase change memory device according to an embodiment of the invention may be configured in such a manner that the discharge control circuit 42 generates the discharge control signal BLDIS activated at HIGH prior to and after the active operation ACTIVE of the phase change memory device, as shown in FIG. 10. In this case, the discharge circuit 43 discharges the bitlines BL0 through BLn during the activation of the discharge control signal BLDIS prior to and after the active operation ACTIVE of the phase change memory device.

Methods of discharging a bitline in a phase change memory device according to the present invention will be described in some additional detail with reference to FIGS. 6, 8, and 10.

The writing/reading circuit 46 includes a writing circuit for writing data to the memory cell array 40 and a reading circuit for reading data from the memory cell array 40. The writing circuit includes an electric current control circuit, an electric current driving circuit, etc., while the reading circuit includes a pre-charge circuit, a clamp circuit, a sense amplifier, etc. Since various configurations and related operating principals for the reading/writing circuit 46 are deemed to be within the range of ordinary skill in the art, a more detailed description will be omitted here.

Figure 5:
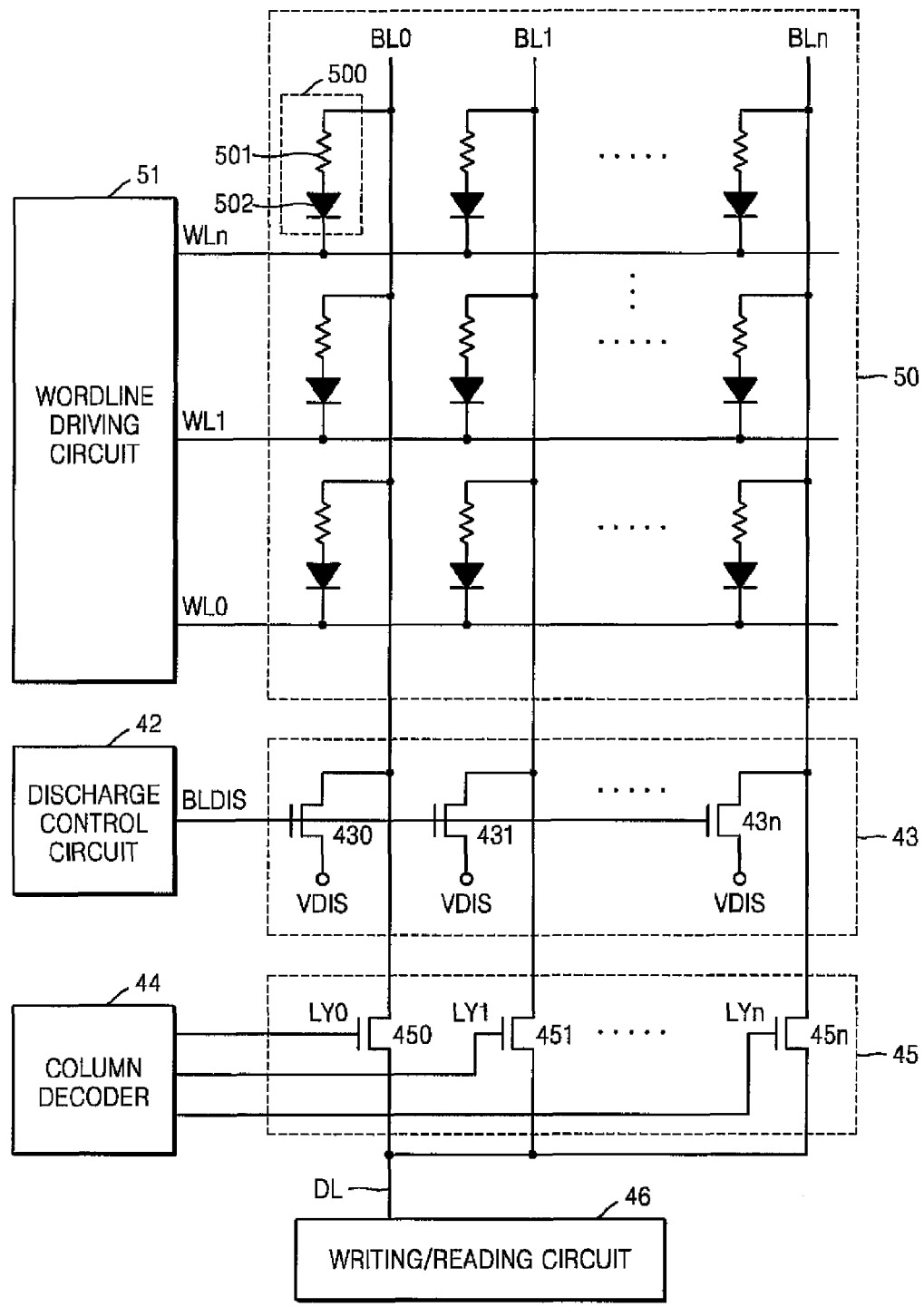
FIG. 5 is a schematic block diagram of a phase change memory device according to another embodiment of the invention.

FIG. 5 is a block diagram of a phase change memory device according to another embodiment of the invention. Referring to FIG. 5, the phase change memory device includes a memory cell array 50, a wordline driving circuit 51, the discharge control circuit 42, the discharge circuit 43, the column decoder 44, the bitline selecting circuit 45, and the writing/reading circuit 46.

The memory cell array 50 includes a plurality of diode switch type phase change memory cells 500. The diode switch type phase change memory cells 500 are connected to the plurality of wordlines WL0 through WLn and the plurality of bitlines BL0 through BLn. Each of the memory cells 500 includes a memory element 501, connected to one of the bitlines BL0 through BLn at one end, and a select element 502, interconnected between another end of the memory element 501 and one of the wordlines WL0 through WLn.

The memory element 501 includes a phase change material, while the select element 502 includes a diode interconnected between the other end of the memory element 501 and one of the wordlines WL0 through WLn.

The wordline driving circuit 51 is connected to the wordlines WL0 through WLn and decodes an externally provided input row address to select the wordlines WL0 through WLn. The wordline driving circuit 51 selectively activates the wordlines WL0 through WLn when the phase change memory device is in active operation. In the diode switch type phase change memory device as shown in FIG. 5, the wordlines WL0 through WLn are selectively activated at GND in the active operation of the phase change memory device and rise to the supply voltage level VCC on standby of the phase change memory device, unlike in the case of the MOS switch type phase change memory device.

The column decoder 44 and the bitline selecting circuit 45 may be the same as the column decoder 44 and bitline selecting circuit 45 shown in FIG. 4. Also, the discharge control circuit 42 and the discharge circuit 43 may be the same as the discharge control circuit 42 and discharge circuit 43 shown in FIG. 4. Also, the writing/reading circuit 46 may be the same as the writing/reading circuit 46 shown in FIG. 4. Therefore, detailed descriptions of the column decoder 44, bitline selecting circuit 45, discharge control circuit 42, discharge circuit 43, the writing/reading circuit 46, shown in FIG. 5, will not be repeated here.

Figure 7A:
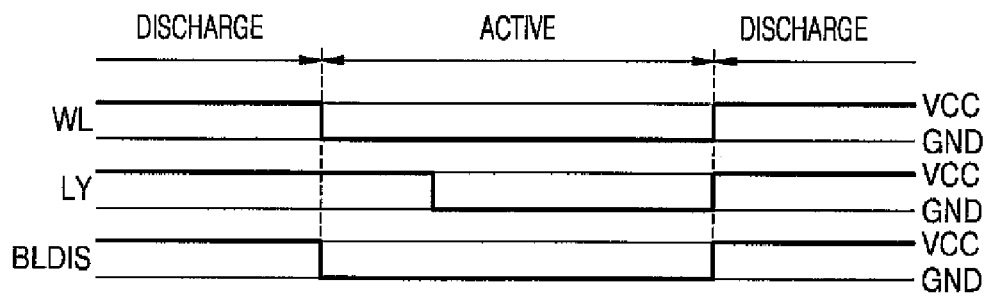
FIG. 7A is a timing diagram further describing a method of discharging a bitline in the phase change memory device shown in FIG. 5 according to an embodiment of the invention.
Figure 7B:
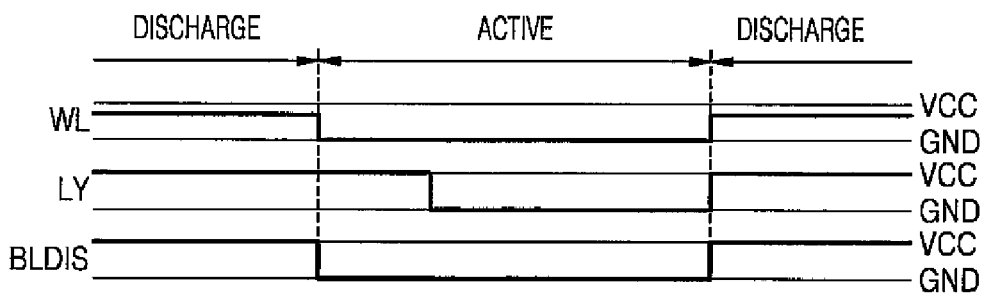
FIG. 7B is a timing diagram further describing a method of discharging a bitline in the phase change memory device shown in FIG. 5 according to another embodiment of the invention.

However, the phase change memory device of FIG. 5 is configured in such a manner that the discharge control circuit 42 generates the discharge control signal BLDIS activated at HIGH when the phase change memory device is in standby mode, as shown in FIGS. 7A and 7B, which is the same as the phase change memory device of the embodiment described in relation to FIG. 4. In this case, the discharge circuit 43 always discharges the bitlines BL0 through BLn in response to the discharge control signal BLDIS when the phase change memory device is in standby.

Figure 9A:
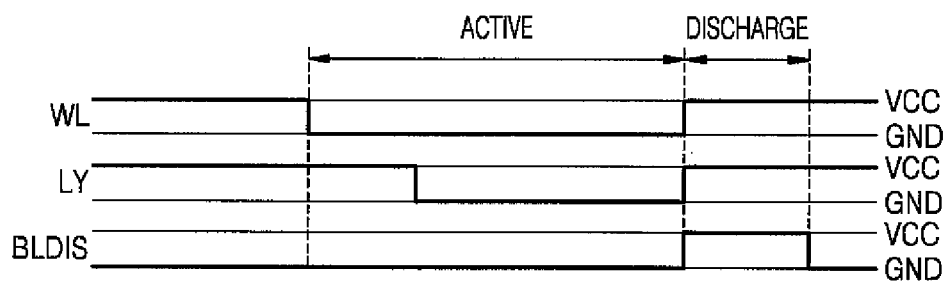
FIG. 9A is a timing diagram further describing a method of discharging a bitline in the phase change memory device shown in FIG. 5 according to another embodiment of the invention.
Figure 9B:
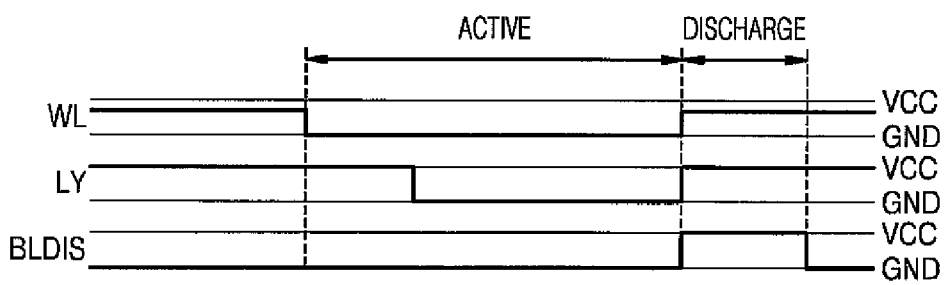
FIG. 9B is a timing diagram further describing a method of discharging a bitline in the phase change memory device shown in FIG. 5 according to another embodiment of the invention.

Also, the phase change memory device of FIG. 5 may be configured in such a manner that the discharge control circuit 42 generates the discharge control signal BLDIS activated at HIGH after the active operation ACTIVE of the phase change memory device, as shown in FIGS. 9A and 9B, which is same as the phase change memory device described in relation to FIG. 4. In this case, the discharge circuit 43 discharges the bitlines BL0 through BLn during the activation of the discharge control signal BLDIS after the active operation ACTIVE of the phase change memory device.

Figure 11A:
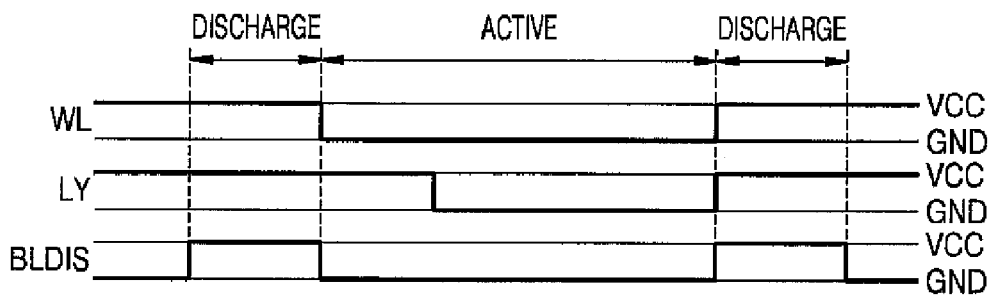
FIG. 11A is a timing diagram further describing a method of discharging a bitline in the phase change memory device shown in FIG. 5 according to another embodiment of the invention.
Figure 11B:
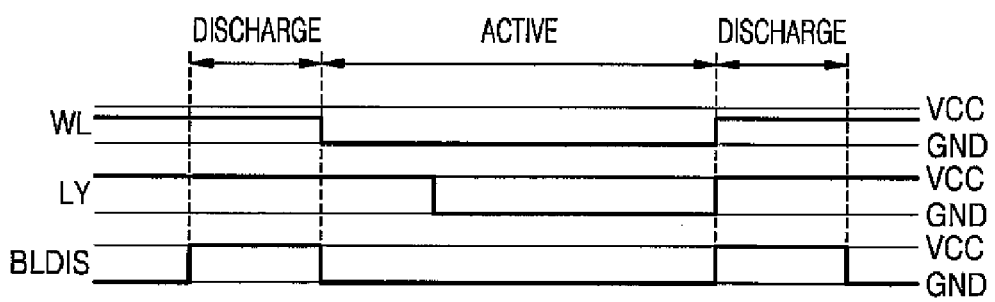
FIG. 11B is a timing diagram further describing a method of discharging a bitline in the phase change memory device shown in FIG. 5 according to another embodiment of the invention.

Also, the phase change memory device of FIG. 5 may be configured in such a manner that the discharge control circuit 42 generates the discharge control signal BLDIS activated at HIGH prior to and after the active operation ACTIVE of the phase change memory device, as shown in FIGS. 11A and 11B, which is the same as the phase change memory device described in relation to FIG. 4. In this case, the discharge circuit 43 discharges the bitlines BL0 through BLn during the activation of the discharge control signal BLDIS prior to and after the active operation ACTIVE of the phase change memory device.

Methods of discharging a bitline in the phase change memory device, such as the ones shown in FIG. 4 according to the present invention will be described in some additional detail with reference to FIGS. 7A, 7B, 9A, 9B, 11A, and 11B.

FIG. 6 is a timing diagram further describing a method of discharging the bitline in the phase change memory device shown in FIG. 4 according to an embodiment of the invention.

Referring to FIG. 6, a bitline BL is always discharged when the phase change memory device is in standby, wherein a wordline WL is activated HIGH during the active operation ACTIVE. Since the phase change memory device according to the embodiment shown in FIG. 4 is a MOS switch type, the wordline WL is activated at the supply voltage level VCC by the wordline driving circuit 41 during the active operation ACTIVE of the phase change memory device, and is dropped to GND level by the wordline driving circuit 41 when the phase change memory device is in standby.

In particular, the discharge control signal BLDIS, which is always activated HIGH when the phase change memory device is in standby, is generated by the discharge control circuit 42. A bitline selecting signal LY is activated HIGH when the phase change memory device is not executing an active operation ACTIVE, and thus the bitline BL and the dataline DL are electrically connected to each other. In other words, the bitline BL is selected by the bitline selecting signal LY.

Then, the bitline BL is discharged by the discharge circuit 43 prior to the active operation ACTIVE. When the phase change memory device is executing an active operation ACTIVE, the discharge control signal becomes LOW, and thus a discharging operation being performed by the discharge circuit 43 is interrupted. Then, a read/write operation is performed during the active operation ACTIVE of the phase change memory device. When the active operation ACTIVE of the phase change memory device is complete, the discharge control signal BLDIS becomes HIGH again, and the bitline BL is discharged by the discharge circuit 43 again.

As described above, the bitline BL is always kept discharged when the phase change memory device is in standby in the exemplary method of discharging the bitline in the phase change memory device shown in FIG. 4. Since it eliminates a need for a discharging operation just prior to the active operation ACTIVE, the overall active time required to execute the method of discharging the bitline in the phase change memory device shown in FIG. 4 is less than that of the conventional device, wherein the conventional method requires some time for discharging the bitline BL prior to the active operation ACTIVE of the phase change memory device, because the time required for discharging the bitline in the phase change memory device just prior to the active operation ACTIVE of the phase change memory device is eliminated according to the present embodiment.

FIG. 7A is a timing diagram further describing a method of discharging the bitline in the phase change memory device shown in FIG. 5 according to an embodiment of the invention.

Referring to FIG. 7A, the bitline BL is always discharged when the phase change memory device is in standby, wherein the wordline WL is activated LOW during the active operation of the phase change memory device, in the method of discharging the bitline in the phase change memory device shown in FIG. 5 according to the present embodiment. Since the phase change memory device according to the embodiment of the present invention shown in FIG. 5 is a diode switch type, the wordline WL is activated at the GND level by the wordline driving circuit 51 during the active operation ACTIVE of the phase change memory device, and rises to the supply voltage level VCC by the wordline driving circuit 51 when the phase change memory device is on standby.

The method of discharging the bitline in the phase change memory device shown in FIG. 5 according to the embodiment of the present invention shown in FIG. 7A is almost the same as the method of discharging the bitline in the phase change memory device shown in FIG. 4 according to the embodiment of the present invention shown in FIG. 6. Therefore, further description of the method of discharging the bitline in the phase change memory device shown in FIG. 5 according to the embodiment of the present invention shown in FIG. 7A will be omitted.

As described above, the bitline BL is always kept discharged when the phase change memory device is in standby in the method of the phase change memory device shown in FIG. 5 according to the embodiment of the present invention shown in FIG. 7A. Since it eliminates a need for a discharging operation just prior to the active operation ACTIVE, the overall active time in the method of discharging the bitline in the phase change memory device shown in FIG. 5 according to the present embodiment is shorter than the overall active time in a method of discharging a bitline in the conventional phase change memory device, wherein the method in the prior art requires some time for discharging the bitline BL just prior to the active operation ACTIVE of the phase change memory device, because the time required for discharging the bitline in the phase change memory device just prior to the active operation ACTIVE of the phase change memory device is eliminated according to the present embodiment.

FIG. 7B is a timing diagram further describing another method of discharging the bitline in the phase change memory device shown in FIG. 5 according to an embodiment of the invention.

Referring to FIG. 7B, the method of discharging the bitline in the phase change memory device shown in FIG. 5 according to the present embodiment is the same as the method of discharging the bitline in the phase change memory device shown in FIG. 4 according to the embodiment of the present invention shown in FIG. 7A. However, the wordline WL is driven by the wordline driving circuit 51 at a voltage level lower than the supply voltage level VCC in order to prevent reverse leakage current when the phase change memory is in standby, in the second method of discharging the bitline in the phase change memory device shown in FIG. 5 according to the present embodiment.

In a diode switch type phase change memory device as shown in FIG. 5, when the phase change memory device is on standby, the bitline BL is discharged and drops to the GND level, and reverse leakage current flows from the bitline BL at the GND level to the wordline WL at the supply voltage level VCC through a diode 502. Therefore, the wordline WL needs to be driven at a voltage level lower than the supply voltage level VCC when the phase change memory device is on standby in order to prevent the reverse leakage current.

The method of discharging the bitline in the phase change memory device shown in FIG. 5 according to the embodiment of the present invention shown in FIG. 7B is almost the same as the method of discharging the bitline in the phase change memory device shown in FIG. 5 according to the embodiment of the present invention shown in FIG. 7A, and thus further description will be omitted.

FIG. 8 is a timing diagram further describing another method of discharging the bitline in the phase change memory device shown in FIG. 4 according to an embodiment of the invention.

Referring to FIG. 8, the bitline BL is discharged during a time period referred to by the DISCHARGE section noted in FIG. 8, after the active operation ACTIVE of the phase change memory device, during which the wordline WL is HIGH. As in the case of the previously described method of discharging the bitline in the phase change memory device, the wordline WL is activated at the supply voltage level VCC by the wordline driving circuit 41 during the active operation ACTIVE of the phase change memory device, and is dropped to the GND level by the wordline driving circuit 41 when the phase change memory device is in standby.

More particularly, the discharge control signal BLDIS, activated HIGH during the DISCHARGE period following the active operation ACTIVE period for the phase change memory device, as generated by the discharge control circuit 42. Then, the bitline selecting signal LY is activated HIGH when the phase change memory device is not in active operation ACTIVE, and thus the bitline BL and the dataline DL are electrically connected to each other. In other words, the bitline BL is selected by the bitline selecting signal LY.

A read/write operation may be performed during the active operation ACTIVE of the phase change memory device. When the active operation ACTIVE of the phase change memory device is complete, the bitline BL may be discharged by the discharge circuit 43 during the DISCHARGE period, or while the discharge control signal BLDIS is activated HIGH.

As described above, the bitline BL is discharged during a time period following the active operation ACTIVE of the phase change memory device in a method of discharging the bitline in the phase change memory device shown in FIG. 4 according to the present embodiment. In other words, since all operations are performed in a peripheral circuit region of the phase change memory device after the active operation ACTIVE of the phase change memory device, the operation of discharging the bitline BL is performed in advance during the operation of the peripheral circuit prior to the start of the active operation of a following cycle.

Accordingly, since the operation of discharging the bitline BL is performed simultaneously with the operations in peripheral regions in the second method of discharging the bitline in the phase change memory device shown in FIG. 4 according to the present embodiment, the overall active time in the second method of discharging the bitline in the phase change memory device shown in FIG. 4 according to the present embodiment is shorter than the overall active time in a method of discharging a bitline in a phase change memory device in the prior art, wherein the method in the prior art takes a relatively long time to discharge the bitline BL just prior to the active operation ACTIVE of the phase change memory device.

FIG. 9A is a timing diagram further describing a method of discharging the bitline in the phase change memory device shown in FIG. 5 according to another embodiment of the invention.

Referring to FIG. 9A, the bitline BL is discharged during the DISCHARGE period following the active operation ACTIVE of the phase change memory device, during which the wordline WL is activated LOW, in the third method of discharging the bitline in the phase change memory device shown in FIG. 5 according to the present embodiment. Since the phase change memory device according to the embodiment of the present invention shown in FIG. 5 is a diode switch type, the wordline WL is activated at the GND level by the wordline driving circuit 51 during the active operation ACTIVE of the phase change memory device, and is risen to the supply voltage level VCC by the wordline driving circuit 51 when the phase change memory device is in standby.

Since the method of discharging the bitline in the phase change memory device shown in FIG. 5 according to the present embodiment is almost the same as the method previously described for discharging the bitline in the phase change memory device shown in FIG. 4 according to the embodiment of the present invention shown in FIG. 8, further description thereof will be omitted here.

FIG. 9B is a timing diagram further describing a method of discharging the bitline in the phase change memory device shown in FIG. 5 according to another embodiment of the invention.

Referring to FIG. 9B, the method of discharging the bitline in the phase change memory device shown in FIG. 5 according to the present embodiment is almost the same as the method of discharging the bitline in the phase change memory device shown in FIG. 5 according to the embodiment of the present invention shown in FIG. 9A. However, the wordline WL is driven by the wordline driving circuit 51 at a voltage level lower than the supply voltage level VCC to prevent reverse leakage current when the phase change memory is in standby, in the method of discharging the bitline in the phase change memory device shown in FIG. 5 according to the present embodiment.

In a diode switch type phase change memory device as shown in FIG. 5, if the bitline BL is not discharged prior to the active operation ACTIVE of the phase change memory device, reverse leakage current flows so that the level of the bitline BL becomes greater than the GND level, and thus a next sensing operation cannot be performed smoothly. Therefore, the wordline WL needs to be driven at a voltage level lower than the supply voltage level VCC when the phase change memory device is on standby so as to prevent the reverse leakage current in the fourth method of discharging the bitline in the phase change memory device shown in FIG. 5 according to the present embodiment.

Since the method of discharging the bitline in the phase change memory device shown in FIG. 5 according to the present embodiment is almost the same as the third method of discharging the bitline in the phase change memory device shown in FIG. 5 according to the embodiment of the invention shown in FIG. 9A, further description thereof will be omitted here.

FIG. 10 is a timing diagram further describing a method of discharging the bitline in the phase change memory device shown in FIG. 4 according to another embodiment of the invention.

Referring to FIG. 10, the bitline BL is discharged prior to and after the active operation ACTIVE of the phase change memory device, during which the wordline WL is activated HIGH, in the method of discharging the bitline in the phase change memory device shown in FIG. 4 according to the present embodiment. In other words, the bitline BL is discharged during the DISCHARGE period just prior to the active operation ACTIVE of the phase change memory device, and is discharged again during the DISCHARGE period following the active operation ACTIVE of the phase change memory device. As in the case of the previously described method of discharging the bitline in the phase change memory device shown in FIG. 4 according to the embodiment of the present invention shown in FIG. 8, the wordline WL is activated at the supply voltage level VCC by the wordline driving circuit 41 during the active operation ACTIVE of the phase change memory device, and drops to the GND level by the wordline driving circuit 41 when the phase change memory device is in standby.

More particularly, the discharge control signal BLDIS activated HIGH during the DISCHARGE period prior to and after the active operation ACTIVE of the phase change memory device, is generated by the discharge control circuit 42. Then, the bitline selecting signal LY is activated HIGH when the phase change memory device is not in an active operation ACTIVE, and thus the bitline BL and the dataline DL are electrically connected to each other. In other words, the bitline BL is selected by the bitline selecting signal LY.

Then, the bitline BL is first discharged by the discharge circuit 43 while the discharge control signal BLDIS is activated HIGH prior to the active operation ACTIVE of the phase change memory device. Also, the bitline BL is again discharged by the discharge circuit 43 while the discharge control signal BLDIS is activated HIGH after the active operation ACTIVE of the phase change memory device.

As described above, the operation of discharging the bitline BL is performed in advance during the operation of the peripheral circuit after the active operation ACTIVE. Therefore, the time required for discharging the bitline BL just prior to the active operation ACTIVE of the phase change memory device of a following cycle can be reduced. Thus, the overall active time for the method of discharging the bitline in the phase change memory device shown in FIG. 4 according to the present embodiment can be reduced in comparison to the overall active time in a method of discharging a bitline in a conventional phase change memory device, wherein the method in the prior art takes a relatively long time to discharge the bitline BL just prior to the active operation ACTIVE of the phase change memory device.

FIG. 11A is a timing diagram further describing a method of discharging the bitline in the phase change memory device shown in FIG. 5 according to another embodiment of the invention.

Referring to FIG. 11A, the bitline BL is discharged prior to and after the active operation ACTIVE of the phase change memory device, during which the wordline WL is activated LOW, in the method of discharging the bitline in the phase change memory device shown in FIG. 5 according to the present embodiment. In other words, the bitline BL is discharged during the DISCHARGE period just prior to the active operation ACTIVE of the phase change memory device, and is discharged again during the DISCHARGE period after the active operation ACTIVE of the phase change memory device.

Since the phase change memory device according to the embodiment of the present invention shown in FIG. 5 is a diode switch type, the wordline WL is activated at the GND level by the wordline driving circuit 51 during the active operation ACTIVE of the phase change memory device, and is risen to the supply voltage level VCC by the wordline driving circuit 51 when the phase change memory device is on standby.

Since the method of discharging the bitline in the phase change memory device shown in FIG. 5 according to the present embodiment is almost identical to the previously described method of discharging the bitline in the phase change memory device shown in FIG. 4 according to the embodiment of the present invention shown in FIG. 10, further description thereof will be omitted here.

FIG. 11B is a timing diagram further describing a method of discharging the bitline in the phase change memory device shown in FIG. 5 according to another embodiment of the invention.

Referring to FIG. 11B, the sixth method of discharging the bitline in the phase change memory device shown in FIG. 5 according to the present embodiment is almost the same as the method of discharging the bitline in the phase change memory device shown in FIG. 5 according to the embodiment of the present invention shown in FIG. 11A. However, the wordline WL is driven by the wordline driving circuit 51 at a voltage level lower than the supply voltage level VCC to prevent reverse leakage current when the phase change memory is on standby, in the method of discharging the bitline in the phase change memory device shown in FIG. 5 according to the present embodiment.

In a diode switch type phase change memory device as shown in FIG. 5, if the bitline BL is not discharged prior to the active operation ACTIVE of the phase change memory device, reverse leakage current flows resulting in the level of the bitline BL becoming greater than the GND level, and thus a next sensing operation cannot be performed smoothly. Therefore, the wordline WL needs to be driven at a voltage level lower than the supply voltage level VCC when the phase change memory device is on standby in order to prevent the reverse leakage current in the sixth method of discharging the bitline in the phase change memory device shown in FIG. 5 according to the present embodiment.

Since the method of discharging the bitline in the phase change memory device shown in FIG. 5 according to the present embodiment is almost the same as the previously described method of discharging the bitline in the phase change memory device shown in FIG. 5 according to the embodiment of the present invention shown in FIG. 11A, further description thereof will be omitted here.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase change memory device comprising:
  a memory cell connected to a wordline and a bitline;
  a wordline driving circuit connected to the wordline and activating the wordline when the phase change memory device is in an active operation;
  a discharge control circuit generating a discharge control signal activated when the phase change memory device is in standby; and
  a discharge circuit connected to the bitline and discharging the bitline when the phase change memory device is in standby in response to the activation of the discharge control signal,
  wherein the memory cell comprises:
    a memory element connected at one end to the bitline and comprising a phase change material; and
    a select element connected to another end of the memory element to select the memory cell, the select element being a diode interconnected between the other end of the memory element and the wordline, and
  the wordline drops to a ground level when the phase change memory device is in the active operation, and rises to a supply voltage level when the phase change memory device is in standby.

2. The phase change memory device of claim 1, wherein the discharge circuit comprises an n-type metal-oxide semiconductor (NMOS) transistor interconnected between the bitline and a discharge voltage terminal and including a gate receiving the discharge control signal.

3. A phase change memory device comprising:
  a memory cell connected to a wordline and a bitline;
  a wordline driving circuit connected to the wordline and activating the wordline when the phase change memory device is in an active operation;
  a discharge control circuit generating a discharge control signal activated when the phase change memory device is in standby; and a discharge circuit connected to the bitline and discharging the bitline when the phase change memory device is in standby in response to the activation of the discharge control signal, wherein the memory cell comprises:

a memory element connected at one end to the bitline and comprising a phase change material; and a select element connected to another end of the memory element to select the memory cell, the select element being a diode interconnected between the other end of the memory element and the wordline, and the wordline drops to a ground level when the phase change memory device is in the active operation, and rises to a voltage level lower than a supply voltage level when the phase change memory device is in standby.

4. The phase change memory device of claim 3, wherein the discharge circuit comprises an n-type metal-oxide semiconductor (NMOS) transistor interconnected between the bitline and a discharge voltage terminal and including a gate receiving the discharge control signal.

5. A phase change memory device comprising:

a memory cell connected to a wordline and a bitline;

a wordline driving circuit connected to the wordline and activating the wordline during an active operation;

a discharge control circuit generating a discharge control signal activated after the active operation; and a discharge circuit connected to the bitline and discharging the bitline in response to the activated discharge control signal following the active operation, wherein the memory cell comprises:

a memory element connected at one end to the bitline and comprising a phase change material; and a select element connected to another end of the memory element to select the memory cell, the select element being a diode interconnected between the other end of the memory element and the wordline, and the wordline drops to a ground level when the phase change memory device is in the active operation, and rises to a supply voltage level when the phase change memory device is in standby.

6. The phase change memory device of claim 5, wherein the discharge control signal is additionally activated prior to the active operation, such that the discharge circuit discharges the bitline in response to the activated discharge control signal prior to and after the active operation.

7. The phase change memory device of claim 5, wherein the discharge circuit comprises an n-type metal-oxide semiconductor (NMOS) transistor interconnected between the bitline and a discharge voltage terminal and includes a gate receiving the discharge control signal.

8. A phase change memory device comprising:

a memory cell connected to a wordline and a bitline;

a wordline driving circuit connected to the wordline and activating the wordline during an active operation;

a discharge control circuit generating a discharge control signal activated after the active operation; and a discharge circuit connected to the bitline and discharging the bitline in response to the activated discharge control signal following the active operation, wherein the memory cell comprises:

a memory element connected at one end to the bitline and comprising a phase change material; and a select element connected to another end of the memory element to select the memory cell, the select element being a diode interconnected between the other end of the memory element and the wordline, and the wordline drops to a ground level when the phase change memory device is in the active operation, and rises to a voltage level lower than the supply voltage level when the phase change memory device is in standby.

9. The phase change memory device of claim 8, wherein the discharge control signal is additionally activated prior to the active operation, such that the discharge circuit discharges the bitline in response to the activated discharge control signal prior to and after the active operation.

10. The phase change memory device of claim 8, wherein the discharge circuit comprises an n-type metal-oxide semiconductor (NMOS) transistor interconnected between the bitline and a discharge voltage terminal and includes a gate receiving the discharge control signal.

11. A method of discharging a bitline in a phase change memory device comprising a memory cell connected to a wordline and the bitline, the method comprising:

only discharging the bitline when the phase change memory device is in standby and the wordline is activated, wherein the memory cell is a diode switch type phase change memory cell, the wordline drops to a ground level when the phase change memory device is in the active operation, and rises to a supply voltage level when the phase change memory device is in standby.

12. The method of claim 11, wherein the discharging of the bitline comprises:

generating a discharge control signal activated when the phase change memory device is in standby; and only discharging the bitline when the phase change memory device is in standby and in response to the activation of the discharge control signal.

13. The method of claim 11, wherein the memory cell is a metal-oxide semiconductor (MOS) switch type phase change memory cell, the wordline rises to a supply voltage level when the phase change memory device is in the active operation, and drops to a ground level when the phase change memory device is in standby.

14. A method of discharging a bitline in a phase change memory device comprising a memory cell connected to a wordline and the bitline, the method comprising:

only discharging the bitline when the phase change memory device is in standby and the wordline is activated, wherein the memory cell is a diode switch type phase change memory cell, the wordline drops to a ground level when the phase change memory device is in the active operation, and rises to a voltage level lower than a supply voltage level when the phase change memory device is in standby.

15. The method of claim 14, wherein the discharging of the bitline comprises:

generating a discharge control signal activated when the phase change memory device is in standby; and only discharging the bitline when the phase change memory device is in standby and in response to the activation of the discharge control signal.

16. The method of claim 14, wherein the memory cell is a metal-oxide semiconductor (MOS) switch type phase change memory cell, the wordline rises to a supply voltage level when the phase change memory device is in the active operation, and drops to a ground level when the phase change memory device is in standby.

* * * * *